United States Patent [19]

Faber

[11] Patent Number: 5,160,357
[45] Date of Patent: Nov. 3, 1992

[54] CONTAINER FOR ELECTRONIC EQUIPMENT

[75] Inventor: Sol Faber, Newton, Mass.

[73] Assignee: GTE Government Systems Corporation, Waltham, Mass.

[21] Appl. No.: 821,505

[22] Filed: Jan. 15, 1992

[51] Int. Cl.$^5$ .................. B01D 46/10; B01D 50/00
[52] U.S. Cl. ...................... 55/385.2; 55/385.6; 55/472; 220/4.02
[58] Field of Search ............ 55/356, 385.1, 385.2, 55/385.6, 472; 220/4.02

[56] References Cited

U.S. PATENT DOCUMENTS 2,243,999  6/1941  Chapple .................. 55/385.2 X
2,735,964  2/1956  Gvieve et al. ............ 55/385.6 X
4,202,676  5/1980  Pelosi et al. ............. 55/472 X Primary Examiner—Charles Hart
Attorney, Agent, or Firm—J. Stephen Yeo

[57] ABSTRACT

A container providing environmental protection to electronic equipment includes a four sided frame, a front cover, and a rear cover. An exhaust fan is mounted on the rear cover and an air filter is mounted on said front cover to allow air to flow through the container. A viewing port is mounted on the front cover. A first door covers the viewing port. An access port on the front cover for allowing manual access to the electronic equipment. A set of elastic flaps is mounted on the cover covering the access port. A second door covers the access port.

1 Claim, 3 Drawing Sheets

CONTAINER FOR ELECTRONIC EQUIPMENT

BACKGROUND OF THE INVENTION

The invention pertains to transport containers for electronic equipment and, more particularly, is concerned with a transport container which provides shelter to electronic equipment both during transit and normal operation of the equipment.

Existing transit containers do not provide environmental protection to electronic equipment which is not militarized or ruggedized, yet must operate during sand, dust or rain conditions. It is desirable to provide a container which protects electronic equipment during operation as well as during transportation.

SUMMARY OF THE INVENTION

According to an aspect of the invention, a container providing environmental protection to electronic equipment includes a four sided frame, a front cover, and a rear cover. An exhaust fan is mounted on the rear cover and an air filter is mounted on said front cover to allow air to flow through the container. A viewing port is mounted on the front cover. A first door covers the viewing port. An access port on the front cover for allowing manual access to the electronic equipment. A set of elastic flaps is mounted on the front cover covering the access port. A second door covers the access port.

DETAILED DESCRIPTION OF THE INVENTION

Figure 1:
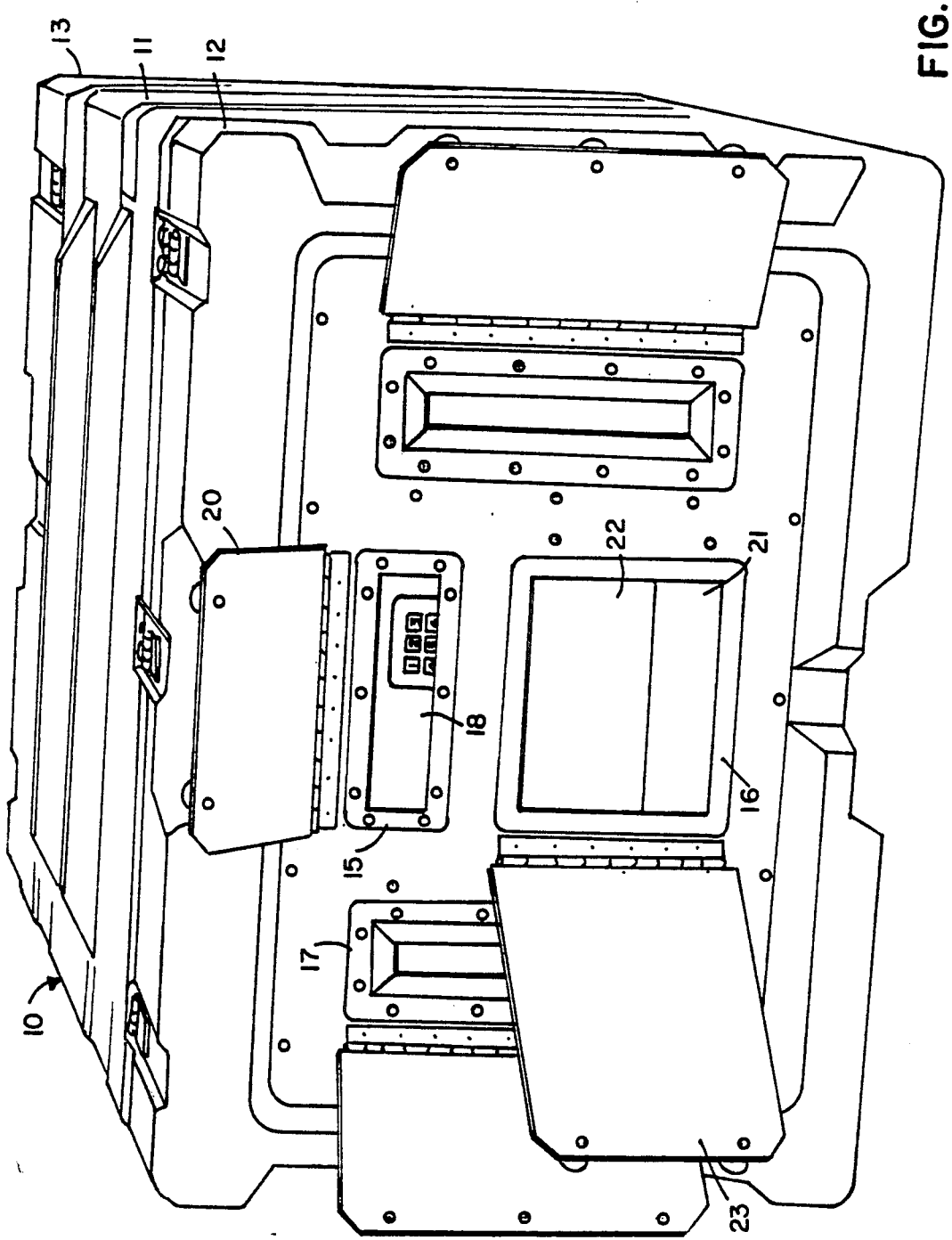
FIGS. 1 and 2 are front and rear views, respectively, of a container for electronic equipment, which embodies the invention.

Referring first to FIG. 1, there is seen a container 10 for electronic equipment. In keeping with invention, container 10 includes a four sided frame 11 and front and rear covers, 12 and 13 respectively. The covers 12, 13 and frame 11 when assembled form a sealed enclosure to protect electronic equipment contained therein from rain, sand and dust.

Figure 3:
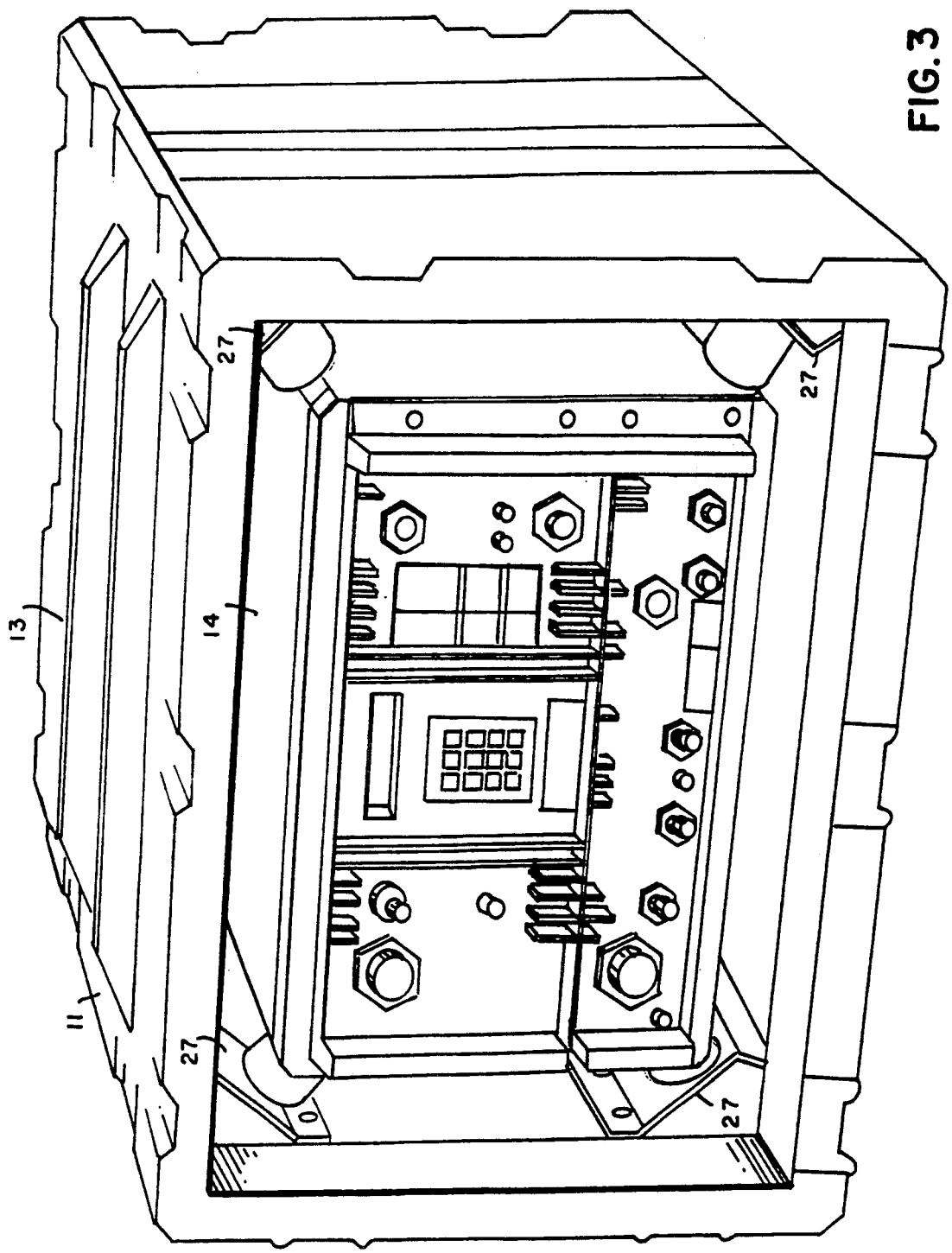
FIG. 3 shows the container with front cover 12 removed.

FIG. 3 shows the container with front cover 12 removed. Shock isolators 27 are connected to the interior corners of container 10 and support electronic equipment 14, isolating the equipment from shock and vibration. These parts of container 10, as so far described, are commercially available.

As a feature of the invention, front cover 12 includes a viewing port 15, an access port 16, and one or more inlet air filters 17.

Viewing port 15 includes a transparent plate 18 made of a material with good impact resistance properties, such as polycarbonate. The material is preferably tinted to dim the lights of electronic equipment 14 for night operations. Plate 18 is assembled to front cover 11 with a weather seal 19, so that container 10 does not lose its water protection properties. Viewing port 15 is covered with a first door 20, which prevents plate 18 from being scratched in transit.

Access port 16 includes a cut-out 21 in front cover 12, Cut-out 16 is large enough for the operator to insert his or her hand to access the controls on the front panel of electronic equipment 14. A set of elastic flaps 22 are mounted on the inside of front cover 11. Flaps 22, which preferably overlap, cover access port 16 to provide sand, dust and rain protection even when the operator is in the process of manipulating the controls of electronic equipment 14. Access port 16 is covered with a second door 23, which has a weather seal 24, so that container 10 does not lose its water protection properties during transit.

Figure 2:
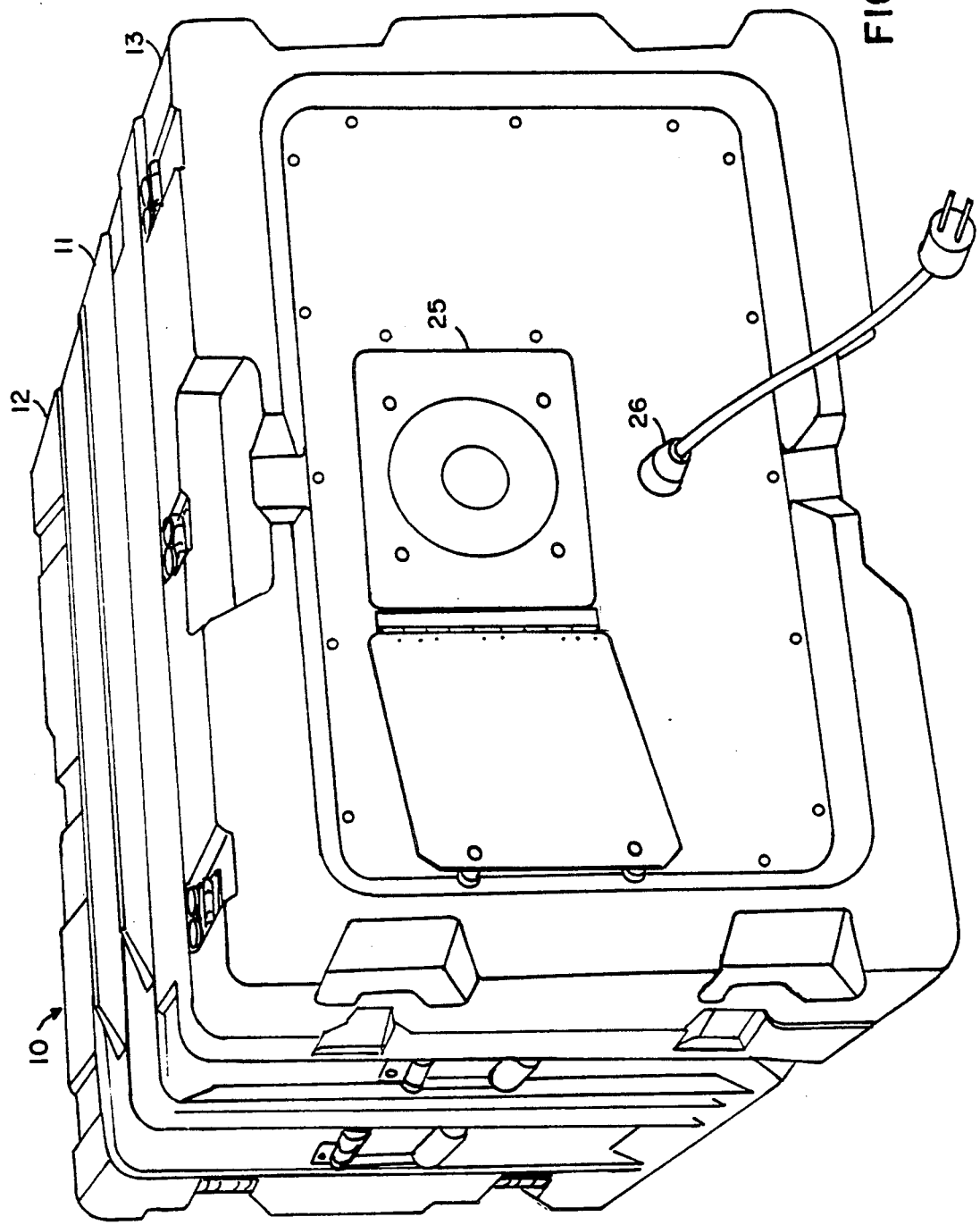

As seen in FIG. 2, rear cover 13 supports an exhaust fan 25 which pulls cooling air through container 10. Power and signal connectors 26 to equipment 14 are mounted through rear cover 13.

The preferred embodiment and best mode of practicing the invention have been described. In light of these teachings, various modifications will be apparent to those skilled in the art. Accordingly the scope of protection is to defined by the following claims.

What is claimed is:

1. A container for providing environmental protection to electronic equipment, comprising:
   a four sided frame;
   front cover;
   a rear cover;
   an exhaust fan mounted on said rear cover an air filter mounted on said front cover to allow air to flow through said container;
   a viewing port mounted on said front cover;
   a first door for covering said viewing port;
   an access port on said front cover for allowing manual access to said electronic equipment;
   a set of elastic flaps mounted on said front cover covering said access port; and
   a second door for covering said access port.

* * * * *